United States Patent
Feng et al.

(10) Patent No.: US 10,418,965 B2
(45) Date of Patent: Sep. 17, 2019

(54) POSITIONING METHOD AND APPARATUS

(71) Applicant: SAMSUNG ELECTRONICS CO., LTD., Suwon-si (KR)

(72) Inventors: Weiming Feng, Guangzhou (CN); Kai Huang, Guangzhou (CN); Xingong Xu, Guangzhou (CN); Rui Hao, Guangzhou (CN); Yuhao Fu, Guangzhou (CN)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 136 days.

(21) Appl. No.: 15/491,109

(22) Filed: Apr. 19, 2017

(65) Prior Publication Data
US 2017/0302248 A1    Oct. 19, 2017

(30) Foreign Application Priority Data

Apr. 19, 2016  (CN) .......................... 2016 1 0242486
Apr. 19, 2016  (CN) .......................... 2016 1 0242927
Apr. 19, 2016  (CN) .......................... 2016 1 0242929
Jan. 13, 2017  (KR) .......................... 10-2017-0006278

(51) Int. Cl.
G01G 19/00   (2006.01)
H03H 9/145   (2006.01)
G01S 13/82   (2006.01)
G01S 5/18    (2006.01)
G01S 5/02    (2010.01)
(Continued)

(52) U.S. Cl.
CPC .............. *H03H 9/145* (2013.01); *G01S 5/02* (2013.01); *G01S 5/14* (2013.01); *G01S 5/18* (2013.01); *G01S 13/74* (2013.01); *G01S 13/825* (2013.01)

(58) Field of Classification Search
CPC ......... G01P 15/02; G08B 21/12; H03H 9/145; G01S 13/825; G08G 1/096716; G08G 1/096783; G06Q 10/087
USPC .............. 340/573.1, 10.41, 3.3, 540, 825.49; 342/146; 455/456.1
See application file for complete search history.

(56) References Cited

U.S. PATENT DOCUMENTS 8,797,141 B2    8/2014   Best et al.
2003/0164713 A1  9/2003  Dollinger et al.
(Continued)

FOREIGN PATENT DOCUMENTS

CN    2358495 Y     1/2000
CN    102576063 A   7/2012
(Continued)

OTHER PUBLICATIONS

Communications issued by the International Searching Authority dated Jun. 23, 2017 in counterpart International Patent Application No. PCT/KR2017/004143 (PCT/ISA/210 & PCT/ISA/237).
(Continued)

*Primary Examiner* — Phuoc H Doan
(74) *Attorney, Agent, or Firm* — Sughrue Mion, PLLC

(57) ABSTRACT

A positioning method includes: emitting an interrogator signal from an electronic device; detecting, by the electronic device, a response signal that is generated and emitted by a sensor among a plurality of sensors, in response to the interrogator signal; and acquire location information about the sensor by identifying the sensor based on the detected response signal. The response signal is generated based on transduction of the interrogator signal.

20 Claims, 12 Drawing Sheets

(51) Int. Cl.
    *G01S 5/14*     (2006.01)
    *G01S 13/74*     (2006.01)

(56) References Cited

U.S. PATENT DOCUMENTS

| | | | |
|---|---|---|---|
| 2008/0088462 A1* | 4/2008 | Breed | B60C 11/24 340/573.1 |
| 2009/0128298 A1 | 5/2009 | Ryu et al. | |
| 2010/0141087 A1 | 6/2010 | Bostan et al. | |
| 2011/0110293 A1 | 5/2011 | Hart et al. | |
| 2013/0137450 A1 | 5/2013 | Dai et al. | |
| 2014/0118193 A1 | 5/2014 | Reichenbach et al. | |
| 2014/0118308 A1 | 5/2014 | Rhee | |
| 2015/0077241 A1 | 3/2015 | Contestabile et al. | |
| 2016/0054440 A1 | 2/2016 | Younis | |

FOREIGN PATENT DOCUMENTS

| | | |
|---|---|---|
| CN | 102889923 A | 1/2013 |
| CN | 103268514 A | 8/2013 |
| CN | 103278798 A | 9/2013 |
| CN | 203376473 U | 1/2014 |
| CN | 204667444 U | 9/2015 |
| DE | 4306660 A1 | 9/1994 |
| JP | 2005-209050 A | 8/2005 |
| KR | 10-2003-0058990 A | 7/2003 |
| TW | 201237905 A1 | 9/2012 |
| WO | 02/29434 A1 | 4/2002 |
| WO | 2009/097617 A2 | 8/2009 |

OTHER PUBLICATIONS

Groves, P., "Principles of GNSS, Inertial, and Multisensor Integrated Navigation Systems", 2013, Second Edition, 3 pages total.
Liu, et al., "A review of Radio Frequency Identification based indoor localization technology", 2014, Journal of Terahertz Science and Electronic Information, Vo. 12, Issue No. 2, pp. 195-201.
Xu, et L., "Research on Surface Acoustic Wave Radio Frequency Identification", 2013, Chinese Excellent Master's Thesis Full-text Database Information Technology Series, Issue No. 2, 4 pages total.
Communication dated Oct. 9, 2017, issued by the State Intellectual Property Office of the People's Republic of China in counterpart Chinese Patent Application No. Chinese Patent Application No. 201610242929.4.
Communication dated Mar. 19, 2018, issued by the State Intellectual Property Office of the People's Republic of China in counterpart Chinese Patent Application No. Chinese Patent Application No. 201610242927.5.
Communication dated Jul. 9, 2018, issued by the State Intellectual Property Office of the People's Republic of China in counterpart Chinese Patent Application No. Chinese Patent Application No. 201610242929.4.
Communication dated Jan. 9, 2019, issued by the State Intellectual Property Office of the People's Republic of China in counterpart Chinese Patent Application No. Chinese Patent Application No. 201610242929.4.
Communication dated Mar. 22, 2019, issued by the European Patent Office in counterpart European Patent Application No. 17786156.4.

\* cited by examiner

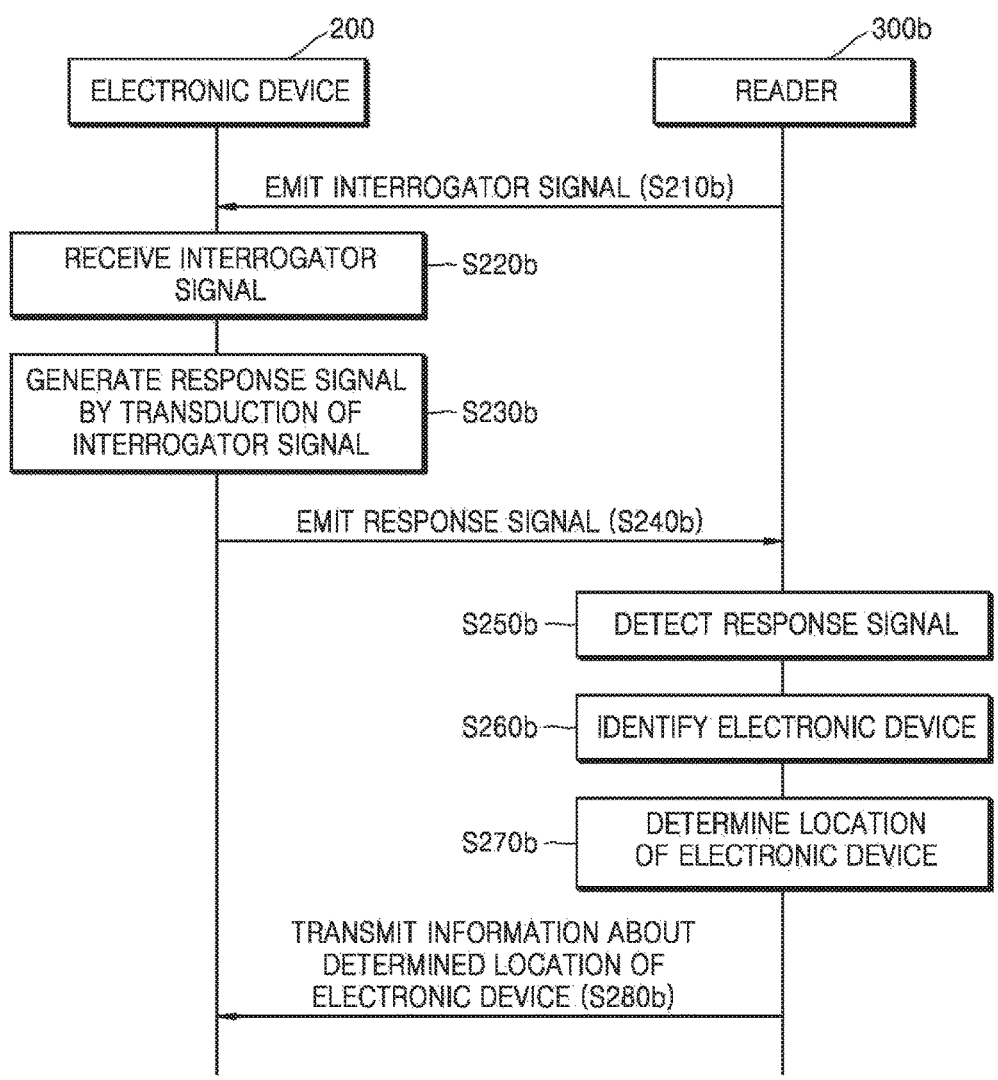

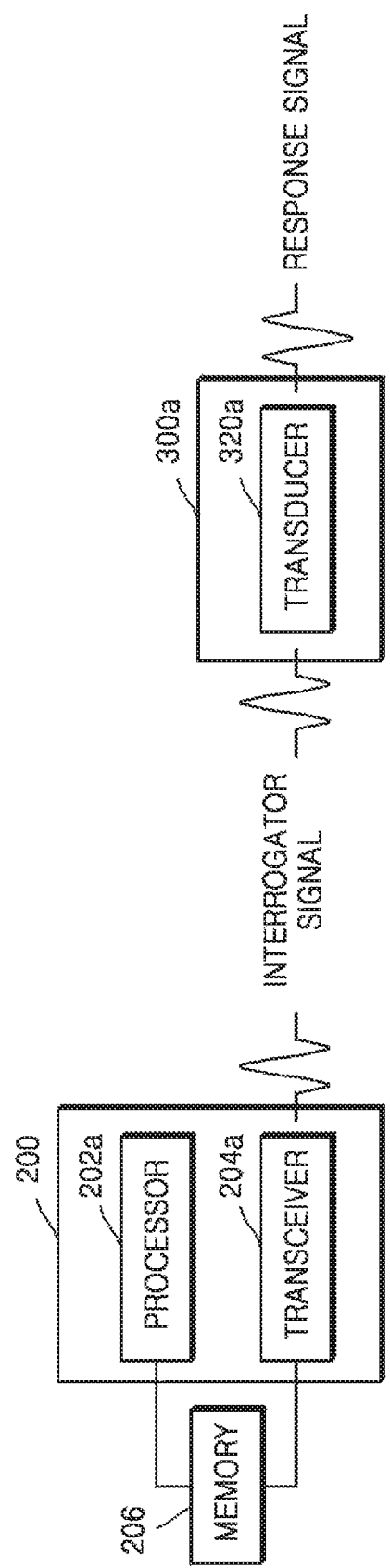

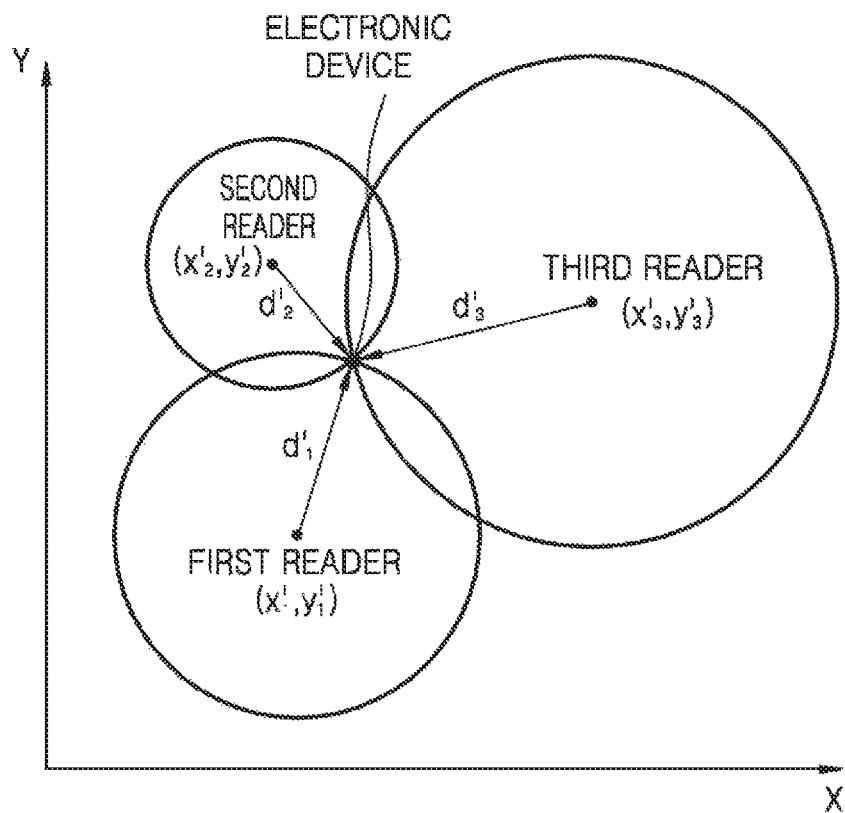

POSITIONING METHOD AND APPARATUS

CROSS-REFERENCE TO RELATED APPLICATIONS

This application claims priority from Chinese Patent Application Nos. 201610242927.5, 201610242486.9, and 201610242929.4 filed Apr. 19, 2016, and from Korean Patent Application No. 10-2017-0006278 filed Jan. 13, 2017, the disclosures of which are incorporated herein by reference in their entireties.

BACKGROUND

Apparatuses and methods consistent with exemplary embodiments relate to a method of positioning, a positioning system, and an electronic device.

A positioning service, such a car navigation service and a route search service, generally uses a global positioning system (GPS) to provide information about a location for users.

However, when users are in a tunnel, forest, or indoor environment where a GPS signal is not detectable, the positioning service might not be available.

A positioning service based on wireless fidelity (Wi-Fi) communication or Bluetooth communication may be provided to users who are indoors. However, Wi-Fi communication and Bluetooth communication cause a positioning system and users' devices to consume a large amount of power. Accordingly, battery consumption also may increase, and frequent battery exchange may worsen environmental pollution.

SUMMARY

The exemplary embodiments may address at least the above problems and/or disadvantages and other disadvantages not described above. Also, the exemplary embodiments are not required to overcome the disadvantages described above, and may not overcome any of the problems described above.

In an exemplary embodiment, a positioning method includes: emitting an interrogator signal from an electronic device; detecting, by the electronic device, a response signal that is generated and emitted by a sensor among a plurality of sensors, in response to the interrogator signal; and acquiring location information about the sensor by identifying the sensor based on the detected response signal, wherein the response signal is generated based on transduction of the interrogator signal.

In an exemplary embodiment, the plurality of sensors are configured to generate response signals having characteristics different from each other.

In an exemplary embodiment, the plurality of sensors include a plurality of passive sensors having different designs.

In an exemplary embodiment, the plurality of sensors include a plurality of surface acoustic wave (SAW) sensors, In an exemplary embodiment, each of the plurality of SAW sensors includes a substrate and an interdigital transducer patterned on the substrate, and the interdigital transducers of the plurality of SAW sensors have different patterns.

In an exemplary embodiment, the plurality of sensors include a plurality of surface acoustic wave (SAW) sensors, In an exemplary embodiment, each of the plurality of SAW sensors includes an interdigital transducer and a reflection grating distanced apart from the interdigital transducer, and a distance between the interdigital transducer and the reflection grating differs among the plurality of SAW sensors.

In an exemplary embodiment, the detecting the response signal includes detecting additional response signals that are generated and emitted by at least two sensors among the plurality of sensors, in response to the interrogator signal, the at least two sensors being different from the sensor, and the acquiring the location information includes acquiring location information about the at least two sensors by identifying the at least two sensors based on the detected additional response signals.

In an exemplary embodiment, the response signal from the sensor and the additional response signals are received, by the electronic device, earlier than response signals from a remainder of sensors of the plurality of sensors.

In an exemplary embodiment, the response signal from the sensor and the additional response signals have greater signal strengths than that of response signals from a remainder of sensors of the plurality of sensors.

In an exemplary embodiment, the emitting the interrogator signal includes: emitting the interrogator signal when it is determined that the electronic device has moved from an outside of a building to an inside of the building.

In an exemplary embodiment, the emitting the interrogator signal includes: emitting the interrogator signal in response to failing to receive a global positioning system (GPS) signal.

In an exemplary embodiment, the method further includes: storing identification information and location information about the plurality of sensors, wherein the acquiring the location information includes acquiring the location information about the sensor by identifying the sensor based on the identification information and the location information about the plurality of sensors and the detected response signal.

In an exemplary embodiment, the method further includes: determining a location of the electronic device based on the location information about the sensor.

In an exemplary embodiment, an electronic device includes: a memory configured to store instructions; and at least one processor configured to execute the instructions to control the electronic device to emit an interrogator signal, detect a response signal that is generated and emitted by a sensor among a plurality of sensors, in response to the interrogator signal, and acquire location information about the sensor by identifying the sensor based on the detected response signal, wherein the response signal is generated based on transduction of the interrogator signal.

In an exemplary embodiment, the at least one processor is further configured to execute the instructions to control the electronic device to detect additional response signals that are generated and emitted by at least two sensors among the plurality of sensors, in response to the interrogator signal, and acquire location information about the at least two sensors by identifying the at least two sensors based on the detected additional response signals, wherein the at least two sensors are different from the sensor.

In an exemplary embodiment, the at least one processor is further configured to execute the instructions to control the electronic device to emit the interrogator signal in response to determining that the electronic device has moved from an outside of a building to an inside of the building.

In an exemplary embodiment, the memory is further configured to store identification information and location information about the plurality of sensors, and the at least one processor is further configured to execute the instructions to control the electronic device to acquire the location information about the sensor by identifying the sensor based on the identification information and the location information about the plurality of sensors, and the detected response signal.

In an exemplary embodiment, the at least one processor is further configured to execute the instructions to control the electronic device to determine a location of the electronic device based on the location information about the sensor.

In an exemplary embodiment, a positioning method includes: receiving, by an electronic device, an interrogator signal from a reader among a plurality of sensors; generating a response signal based on transduction of the received interrogator signal; emitting the generated response signal; and acquiring information about an electronic device location which is determined by the reader having received the emitted response signal.

In an exemplary embodiment, a method includes: emitting an interrogator signal from an electronic device; receiving the interrogator signal by a sensor of a plurality of sensors dispersed within a closed environment; transducing the received interrogator signal into a response signal, by the sensor, the response signal having a certain characteristic attributable to the sensor; detecting, by the electronic device, the response signal that has been emitted by the sensor; acquiring a location of the sensor by identifying the sensor based on the certain characteristic in the detected response signal, the location of the sensor being pre-stored in a memory; and calculating a location of the electronic device based on the location of the sensor.

In an exemplary embodiment, the interrogator signal is additionally received by two sensors which are included into the plurality of sensors and are different from the sensor, the received interrogator signal is transduced by each of the two sensors into corresponding response signals, each of the corresponding response signals has a certain characteristic, and the method further includes: additionally detecting, by the electronic device, the corresponding response signals that have been emitted by the two sensors; acquiring locations of the two sensors by identifying the two sensors based on the certain characteristic in the detected response signals, the locations of the two sensors being pre-stored in the memory; and calculating the location of the electronic device by triangulating the location of the sensor and the locations of the two sensors.

In an exemplary embodiment, the transducing includes: transmitting, by a transducer of the sensor, the interrogator signal as a sound wave on a surface of the sensor in a transmission direction; reflecting the sound wave in a direction opposite to the transmission direction, toward the transducer; and emitting, by the transducer, the response signal transduced from the sound wave.

In an exemplary embodiment, the certain characteristic is based on a time during which the sound wave propagates in the transmission direction before being reflected.

BRIEF DESCRIPTION OF DRAWINGS

The above and/or other aspects will become more apparent by describing certain exemplary embodiments with reference to the accompanying drawings, in which:

FIG. 2B illustrates a flowchart of an example positioning method.

FIG. 3A illustrates an electronic device and a sensor, according to an example embodiment.

FIG. 5B illustrates a graph representing locations of three sensors and an electronic device, according to an example embodiment.

DETAILED DESCRIPTION

Figure 1A:
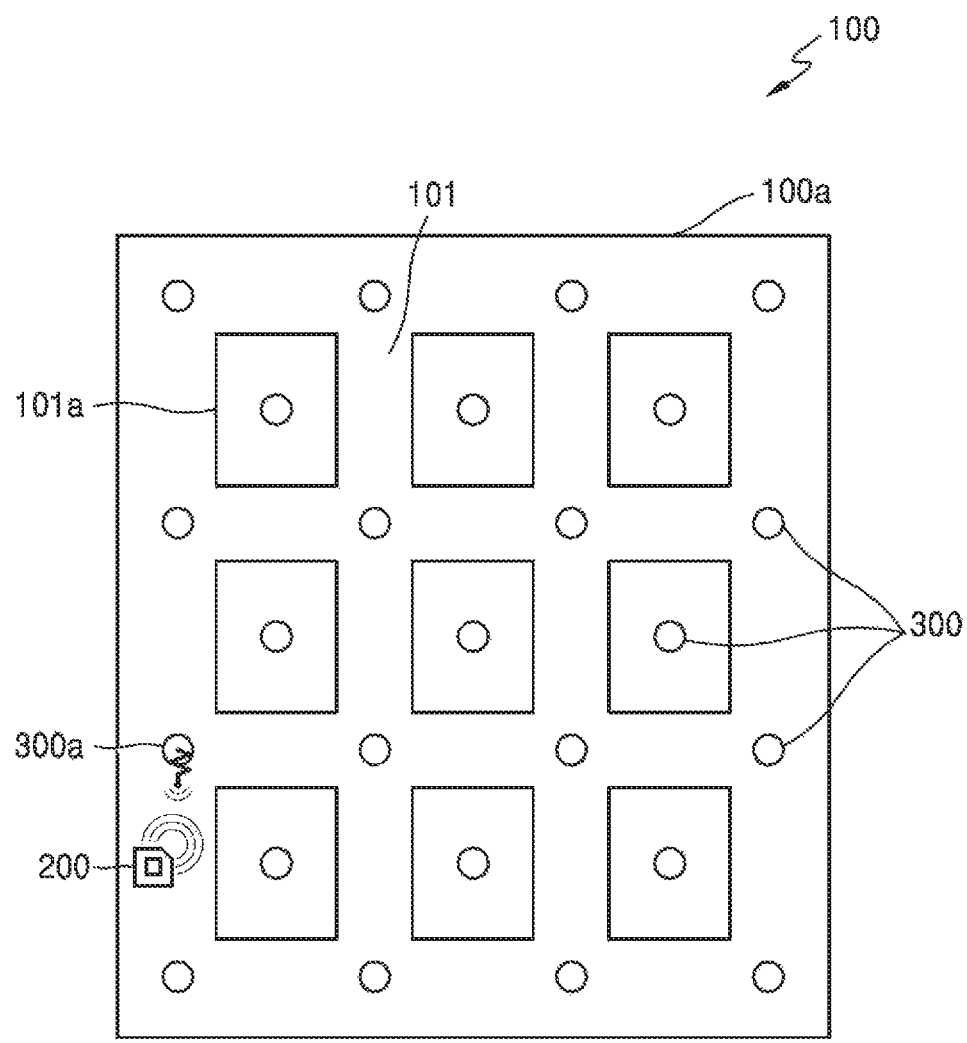
FIG. 1A schematically illustrates a plan view of an indoor environment according to an example embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

In the present disclosure, it should be understood that the terms "comprises," "comprising," "including," and "having" are inclusive and therefore specify the presence of stated features or components, but do not preclude the presence or addition of one or more other features or components. In the present disclosure, terms such as " . . . unit" and " . . . module" should be understood as a unit in which at least one function or operation is processed and may be embodied as hardware, software, or a combination of hardware and software.

FIG. 1A schematically illustrates a plan view of an indoor environment 100 according to an example embodiment.

Referring to FIG. 1A, a plurality of sensors 300 including a sensor 300a may be located in a same floor 100a of a building. An electronic device 200 may be one of the electronic devices within the indoor environment 100 and may communicate with the sensor 300a, which is closer to the electronic device 200 than other sensors to identify the sensor 300a, and acquire location information about the sensor 300a to determine a location of the electronic device 200. The electronic device 200 and the sensor 300a may communicate with each other by short range communication. The electronic device 200 may include a radio frequency identification (RFID) reader to communicate with the sensor 300a. The electronic device 200 may be located in the floor 100a. A floor of the building may include aisles 101 and spaces 101a (e.g., rooms) divided by aisles 101.

Figure 1B:
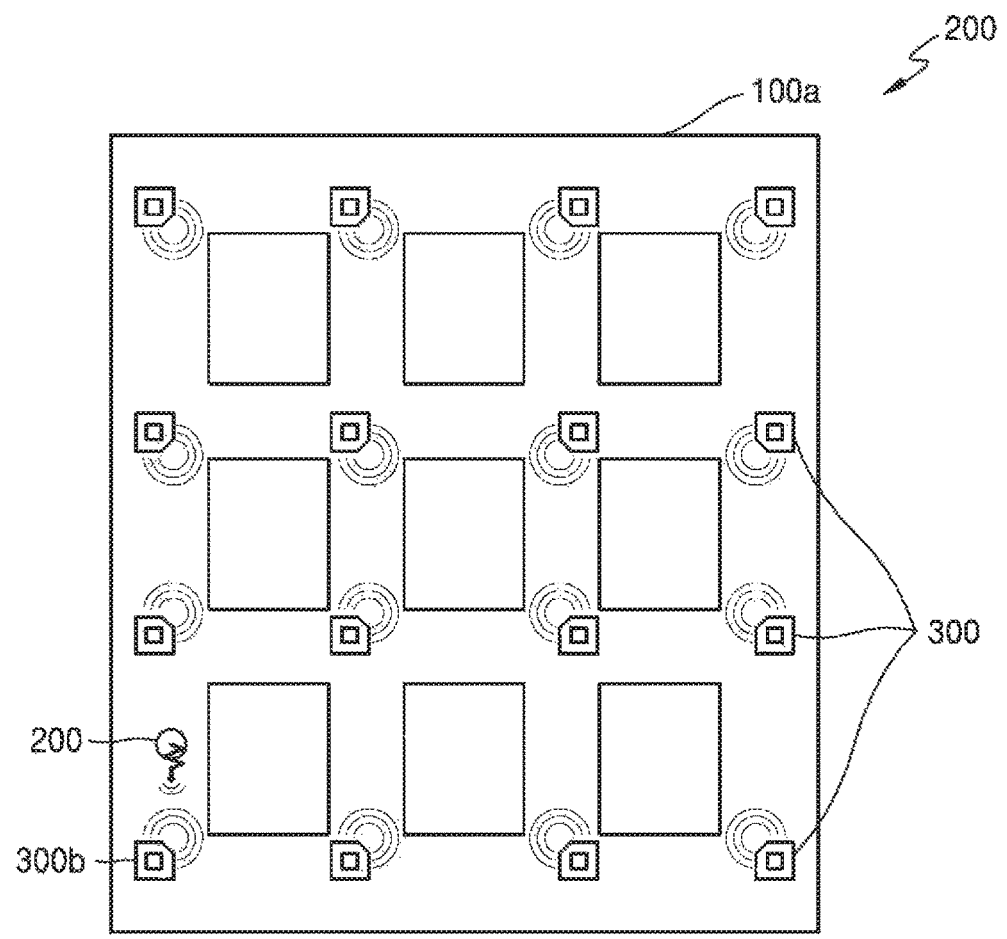
FIG. 1B schematically illustrates a plan view of an indoor environment according to an example embodiment.

FIG. 1B schematically illustrates a plan view of an indoor environment 200 according to an example embodiment.

Referring to FIG. 1B, the sensors may be embodied as readers 300b and may be located in a same floor 100a of a building. An electronic device 200 may communicate with the reader 300b which is closer to the electronic device 200 than other readers to identify the reader 300*b*, and then acquire information about a location of the electronic device 200 determined based on the reader 300*b*. The electronic device 200 and the reader 300*b* may communicate with each other by short range communication. The reader 300*b* may be an RFID reader capable of communicating with the electronic device 200. The electronic device 200 may include an RF sensor to communicate with the reader 300*b*. The RF sensor may be an RF tag.

A method of acquiring location information of a sensor among a plurality of sensors is described below by referring to FIGS. 1A and 2A.

In operation S210*a*, the electronic device 200 may emit an interrogator signal. The interrogator signal may be an RF signal, and be emitted through an antenna of the electronic device 200. In an example embodiment, the interrogator signal may be generated by an RFID reader included in the electronic device 200, but is not limited thereto. When the RFID reader is located outside of the electronic device 200, a location of the RFID reader may be determined instead of the electronic device 200.

In an example embodiment, the electronic device 200 may emit the interrogator signal when it is determined that the electronic device 200 has moved from the outside of the building to the inside thereof. For example, the electronic device 200 may emit the interrogator signal when receiving of a GPS signal fails. The electronic device 200 may stop emitting the interrogator signal when receiving a GPS signal. Accordingly, the electronic device 200 may efficiently emit the interrogator signal so resources and power may be conserved.

In operation S220*a*, the sensor 300*a* may receive the interrogator signal emitted from the electronic device 200. The interrogator signal may be received through an antenna of the sensor 300*a*. In FIGS. 1A and 2A, it is illustrated that the interrogator signal emitted from the electronic device 200 is received by one sensor 300*a*, but is not limited thereto. For example, the interrogator signal emitted from the electronic device 200 may be received by two or more sensors.

In operation S230*a*, the sensor 300*a* may generate a response signal based on transduction of the interrogator signal. In an example embodiment, the sensor 300*a* may generate the response signal by using the interrogator signal for power. In an example embodiment, the sensor 300*a* may be a passive sensor containing passive elements. For example, when the sensor 300*a* is a surface acoustic wave (SAW) sensor, the interrogator signal is transduced into a surface acoustic wave which is then transduced into the response signal. The passive sensor is not connected to a battery or power source so it may need less maintenance than an active sensor. Therefore, positioning methods according to example embodiments may be used outside where electric power is not supplied well.

Response signals emitted by a plurality of sensors may be distinguished from each other. In an example embodiment, the response signals may have different characteristics, and the electronic device 200 may identify, based on different signal characteristics, the sensor 300*a* which has emitted a response signal. That is, the response signal of the sensor 300*a* may be used as an identification (ID) of the sensor 300*a*. The response signals may have different signal characteristics according to different designs of the sensors. The response signals are generated based on a received interrogator signal, thus, even when a plurality of interrogator signals are emitted from a plurality of electronic devices, each electronic device may detect a response signal that is generated based on its interrogator signal. Therefore, the electronic device 200 is not affected by other devices according to an example embodiment.

In operation S240*a*, the sensor 300*a* may emit the response signal. The response signal may be an RF signal, and be emitted through an antenna of the sensor 300*a*.

In operation S250*a*, the electronic device 200 may detect the response signal emitted from the sensor 300*a*. The electronic device 200 may perform an additional process such as signal modulation on the detected response signal to identify the sensor 300*a* based on the response signal. In an example embodiment, the response signal may be detected by an RFID reader included in the electronic device 200, but is not limited thereto. When the RFID reader is located outside of the electronic device 200, a location of the RFID reader may be determined instead of the electronic device 200.

When the interrogator signal emitted from the electronic device 200 is received at a plurality of sensors, the plurality of sensors may generate and emit response signals. In an example embodiment, the electronic device 200 may detect one of response signals based on at least one among signal strengths and travel times. That is, the electronic device 200 may use a limited number of response signals, and thus, resources for determining a location of the electronic device 200 may be conserved.

In an example embodiment, the electronic device 200 may detect a response signal that is generated based on an interrogator signal from the electronic device 200. In an example embodiment, the electronic device 200 does not detect response signals generated based on interrogator signals from other devices. Therefore, the electronic device 200 is not affected by response signals that are generated based on interrogator signals from other devices.

In operation S260*a*, the electronic device 200 may identify the sensor 300*a* based on the response signal. Response signals emitted by sensors are distinguished from each other, thus, the electronic device 200 may identify among sensors the sensor 300*a* that has emitted the response signal. That is, the response signal may function as an ID of the sensor 300*a*.

In an example embodiment, the electronic device 200 may store identification information about sensors, and search for identification information about the sensor 300*a* based on the detected response signal. The identification information about the sensors may be stored in a server, and the electronic device 200 may request the server to identify the sensor 300*a* among the sensors based on the detected response signal. The electronic device 200 may download the identification information about the sensors from the server.

In operation S270*a*, the electronic device 200 may acquire location information about the sensor 300*a*. When sensors are located in a building, location information about the sensors may include information about where the sensors are located in the building, in which floor the sensors are located, and in which room or aisle the sensors are located, but is not limited thereto. The location information about the sensors may be represented by two or three dimensional coordinates, but is not limited thereto. When the location information about the sensors is represented by three dimensional coordinates, one of coordinates may indicate which floor the sensors are located. Locations of the sensors may be fixed, and thus, the location information about the sensors does not change as identification information about the sensors. The location information and the identification information about the sensors may be paired with each other, e.g., associated with each other.

In an example embodiment, the electronic device 200 may periodically or continuously emit an interrogator signal, thereby detecting response signals from sensors and determining or tracking a route of the electronic device 200. As a signal strength of a detected response signal from a sensor is reduced or a travel time thereof is increased, it may be determined that the electronic device 200 is getting farther away from the sensor. As a signal strength of a detected response signal from a sensor is increased or a travel time thereof is decreased, it may be determined that the electronic device 200 is getting closer to the sensor.

In an example embodiment, the electronic device 200 may store location information about sensors and acquire location information about the sensor 300*a* among the sensors based on a detected response signal from the sensor 300*a*. The location information about the sensors may be stored in a server, and the electronic device 200 may request the server to identify the sensor 300*a* among the sensors based on the detected response signal from the sensor 300*a*. The electronic device 200 may download the location information about the sensors from the server.

In an example embodiment, the electronic device 200 may acquire location information about the identified sensor 300*a* to determine a location of the electronic device 200. For example, a location represented by the location information about the identified sensor 300*a* may be determined as a location of the electronic device 200. In an example embodiment, the electronic device 200 may determine the location of the electronic device 200 based on detected response signals from one or more identified sensors. For example, a location of the electronic device 200 may be determined by locations represented by location information about the one or more identified sensors, and, for example, may be a center of the locations.

In an example embodiment, the electronic device 200 may mark the location of the electronic device 200 on a map based on the location information about the identified sensor 300*a*. Location information about sensors that are located in a certain area may be mapped onto a map of the area. The location information about the sensors may be mapped with respect to corresponding locations on the map. The area may be a park, structure, building, mountain, and tunnel, but is not limited thereto. The map may be a planar map, but is not limited thereto. A map of a building may include a planar map of each floor. The electronic device 200 may download a map from a server.

In an example embodiment, the electronic device 200 may download identification information and location information about sensors, and a map of an area where the sensors are located. The identification information and location information about the sensors may be mapped onto the map, and mapped with respect to corresponding locations on the map.

A method of acquiring information about a location of the electronic device is described below by referring to FIGS. 1B and 2B.

In operation S210*b*, the plurality of readers including the reader 300*b* respectively emit interrogator signals. The interrogator signals emitted by the plurality of readers may be distinguished from each other. For example, the interrogator signals may have different signal patterns. The interrogator signals may be RF signals and be respectively emitted through antennas of the readers. In an example embodiment, the readers may be RFID readers, and the interrogator signals may be generated and emitted by the RFID readers.

In operation S220*b*, the electronic device 200 may detect an interrogator signal emitted from the reader 300*b* in operation S210*b*. Here, the reader 300*b* may be the closest to the electronic device 200 among the plurality of readers. The interrogator signal may be received through an antenna of the electronic device 200. In FIGS. 1B and 2B, it is illustrated that the interrogator signal emitted from the reader 300*b* is received by one electronic device 200, but is not limited thereto. For example, the interrogator signal emitted from the reader 300*b* may be received by two or more electronic devices.

In operation S230*b*, the electronic device 200 may generate a response signal based on transduction of the interrogator signal. In an example embodiment, the electronic device 200 may generate the response signal by using the interrogator signal for power. In an example embodiment, the electronic device 200 may include a sensor that responds to the received interrogator signal from the reader 300*b*. The sensor may be a passive sensor. For example, when the sensor is an SAW sensor, the interrogator signal is transduced into a surface acoustic wave which is then transduced into the response signal. The passive sensor is not connected to a power source so power of a battery of the electronic device 200 may be conserved.

Interrogator signals emitted by the readers may be distinguished from each other, and the response signals emitted by the electronic devices may be distinguished from each other. In an example embodiment, the interrogator signals may have different characteristics, and the electronic device 200 may identify, based on different signal characteristics, the reader 300*b* which has emitted an interrogator signal. Further, the response signal of the electronic device 200 may be used as an ID of the electronic device 200. Response signals may have different signal characteristics according to different designs of the readers which generates the response signals. The response signals are generated based on a received interrogator signal, thus, even when a plurality of interrogator signals are emitted from a plurality of readers, each reader may detect a response signal that is generated based on its interrogator signal. Therefore, a reader is not affected by other readers according to an example embodiment.

In operation S240*b*, the electronic device 200 may emit the response signal. The response signal may be an RF signal, and be emitted through an antenna of the electronic device 200.

In operation S250*b*, the reader 300*b* may detect the response signal emitted from the electronic device 200. The reader 300*b* may perform an additional process such as signal modulation on the detected response signal to identify the electronic device 200 based on the response signal.

In an example embodiment, the reader 300*b* may detect a response signal that is generated based on an interrogator signal from the reader 300*b*. In an example embodiment, the reader 300*b* does not detect response signals that are generated based on interrogator signals from other readers. Therefore, the reader 300*b* is not affected by response signals generated based on interrogator signals from other readers.

In operation S260*b*, the reader 300*b* may identify the electronic device 200 based on the response signal. The electronic device 200 illustrated in FIG. 2B is to be identified by the reader 300*b*, but is not limited thereto, and may be identified by a hub communicating with the reader 300*b*.

In an example embodiment, the reader 300*b* or the hub may acquire identification information about electronic devices, and identify the electronic device 200 based on the identification information and the detected response signal. The identification information about the electronic devices may be acquired from the electronic devices by the hub or readers, and transmitted to the reader 300b or the hub.

In operation S270b, the reader 300b may determine a location of the electronic device 200 based on the identified response signal. The location of the electronic device 200 illustrated in FIG. 2B is to be determined by the reader 300b, but is not limited thereto, and may be determined by a hub communicating with the reader 300b. The hub may determine the location of the electronic device 200 based on a location of the reader 300b. According to an example embodiment, the location of the electronic device 200 may be determined by a plurality of readers that have received response signals from the electronic device 200. In an example embodiment, the hub may communicate with the plurality of readers to determine the location of the electronic device 200. For example, the hub may determine the location of the electronic device 200 as a center of locations of the plurality of readers.

When readers are located in a building, locations of the readers may be represented by where the readers are located in the building, in which floor the readers are located, and in which room or aisle the readers are located, but is not limited thereto. The locations of the readers may be represented by two or three dimensional coordinates, but is not limited thereto. When the locations of the readers are represented by three dimensional coordinates, one of coordinates may indicate in which floor the readers are located. The locations of the readers may be fixed, and thus, information about the locations of the readers does not change as identification information about the readers. The information about the locations of the readers and the identification information about the readers may be paired with each other.

In an example embodiment, the location of the electronic device 200 may be determined based on a signal strength of the response signal received by the reader 300b, or a time period from transmitting an interrogator signal to receiving the response signal.

In an example embodiment, a hub may be located in each floor of a building, and each hub may communicate with readers and the electronic device 200. The hub may communicate with the readers via short-range communication. The short-range communication may include Bluetooth communication, Bluetooth Low Energy (BLE) communication, Near Field Communication (NFC), wireless fidelity (Wi-Fi) communication, ZigBee communication, infrared data association (IrDA) communication, Wi-Fi direct (WFD) communication, ultra-wideband (UWB) communication, Ant+ communication, and Z-wave communication, but is not limited thereto.

A hub may communicate with each other by the short-range communication, but is not limited thereto. The hub may be connected to the electronic device 200 via the same domain network.

The electronic device 200 may receive interrogator signals from a plurality of readers, and then emit response signals correspondingly. The plurality of readers may respectively receive and identify each response signal, and a location of the electronic device 200 may be determined by a reader that of which a received signal has the greatest signal strength or the shortest delay time. That is, by using a limited number of response signals, resources for determining the location of the electronic device 200 may be conserved.

In an example embodiment, readers may periodically or continuously emit interrogator signals, thereby, detecting response signals from the electronic device 200 and determining or track a route of the electronic device 200. As a detected response signal from a reader has a signal strength being reduced or a delay time being increased, it may be determined that the electronic device 200 is getting away from the reader. As a detected response signal from a reader has a signal strength being increased or a travel time being decreased, it may be determined that the electronic device 200 is getting closer to the reader.

In operation S280b, the reader 300b may transmit, to the electronic device identified in operation S260b, information about the location of the electronic device 200 determined in operation S270b. The information about the location of the electronic device 200 is illustrated in FIG. 2B to be transmitted by the reader 300b, but is not limited thereto, may be transmitted by a hub communicating with the reader 300b.

In an example embodiment, the electronic device 200 may mark the location of the electronic device 200 on a map based on the information about the electronic device 200 transmitted from the reader 300b or the hub. Location information about readers that are located in a certain area may be mapped onto a map of the area. The location information about the readers may be mapped with respect to corresponding locations on the map. The area may be a park, structure, building, mountain, and tunnel, but is not limited thereto. The map may be a planar map, but is not limited thereto. A map of a building may include a planar map of each floor. The electronic device 200 may download a map from a server.

In an example embodiment, the electronic device 200 may download identification information and location information about readers, and a map of an area where the readers are located. The identification information and location information about the readers may be mapped onto the map, and mapped with respect to corresponding locations on the map.

Figure 2A:
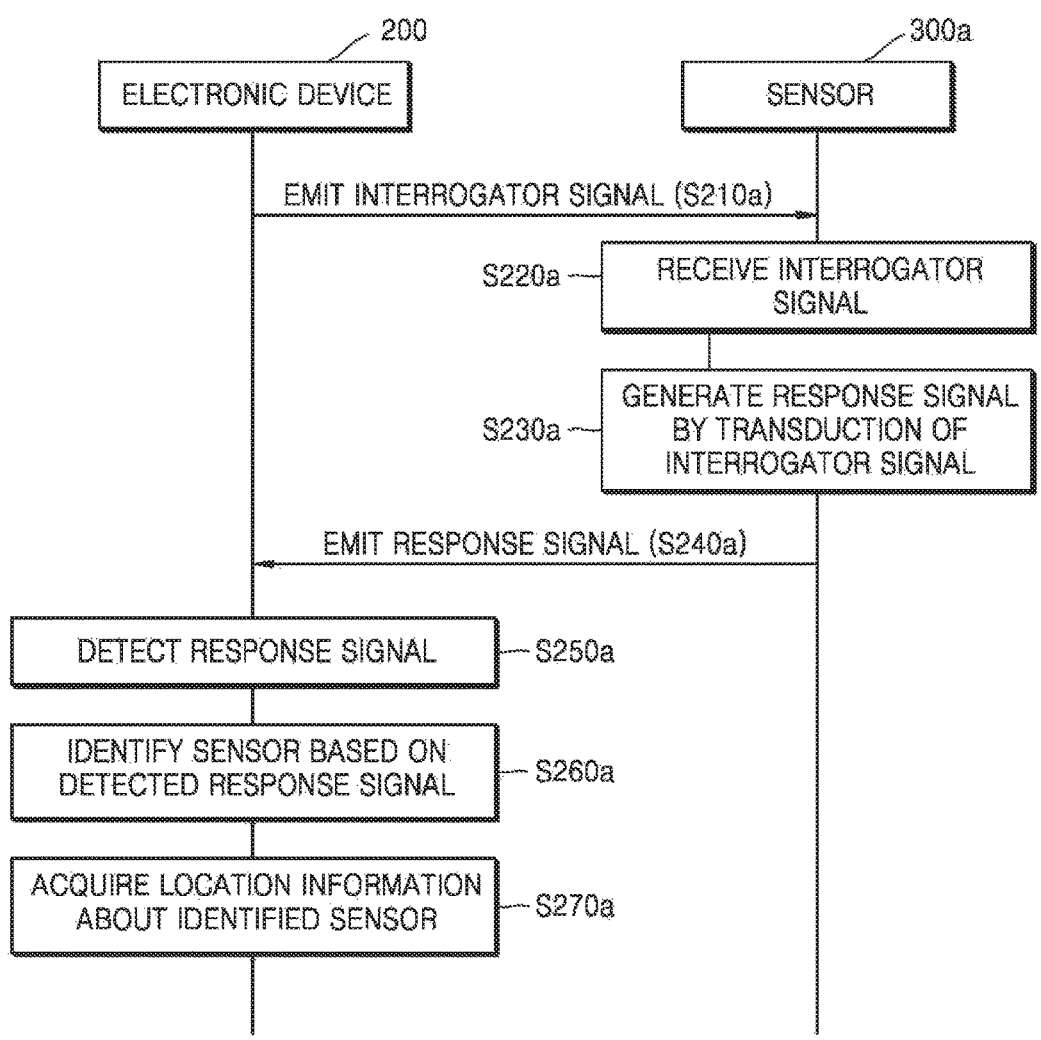
FIG. 2A illustrates a flowchart of an example positioning method.

Referring to FIGS. 1A, 2A, and 3A, the electronic device 200 may emit an interrogator signal, and the sensor 300a may emit a response signal upon receiving the interrogator signal from the electronic device 200, according to an example embodiment. The electronic device 200 may detect the response signal from the sensor 300a to identify the sensor 300a, and acquire location information about the identified sensor 300a.

The electronic device 200 may be a smartphone, tablet, personal digital assistant (PDA), media player, portable multimedia player, e-book reader, digital broadcast device, personal computer (PC), laptop computer, micro server, navigation, MP3 player, or digital camera, but is not limited thereto.

The electronic device 200 is illustrated in FIG. 3A as including a processor 202a and a transceiver 204a, but is not limited thereto. For example, the transceiver 204a might not be included into the electronic device 200 and may be an element of another device. As another example, the transceiver 204a may be included in the electronic device 200 as an element of an RFID reader.

The processor 202a of the electronic device 200 may control operations of methods according to an example embodiment. The processor 202a may be a controller, a microcontroller, or a part thereof. The controller and microcontroller may include a plurality of modules, and each module may perform at least one function or at least one operation.

The transceiver 204a may emit an interrogator signal, and receive a response signal emitted from the sensor 300a. The transceiver 204a may consist of a transmitter for the interrogator signal and a receiver for the response signal. The transceiver 204a may be an element of an RFID reader.

The electronic device 200 may further include a memory 206 for storing a program, one or more instructions, or data. The memory 206 may be included into the electronic device 200 or may be a separate element. The processor 202a of the electronic device 200 may execute a control program, instruction, or data stored in the memory 206 to perform operations of methods according to an example embodiment. The processor 202a may be configured to be coupled with the memory 206 to execute instructions stored in the memory.

The sensor 300a may include a transducer 320a. The transducer 320a may generate a response signal transduced from an interrogator signal. In an example embodiment, the sensor 300a may generate the response signal by using the interrogator signal for power. In an example embodiment, the sensor 300a may be a passive sensor containing passive elements. For example, when the sensor 300a is an SAW sensor, the interrogator signal is transduced into a surface acoustic wave which is then transduced into the response signal.

Response signals generated by transducers of sensors may be distinguished from each other. In an example embodiment, the response signals may have different characteristics, and the electronic device 200 may identify, based on different signal characteristics, the sensor 300a which has emitted a response signal. That is, the response signal generated by the transducers of the sensors may be used as IDs of the sensors.

Figure 3B:
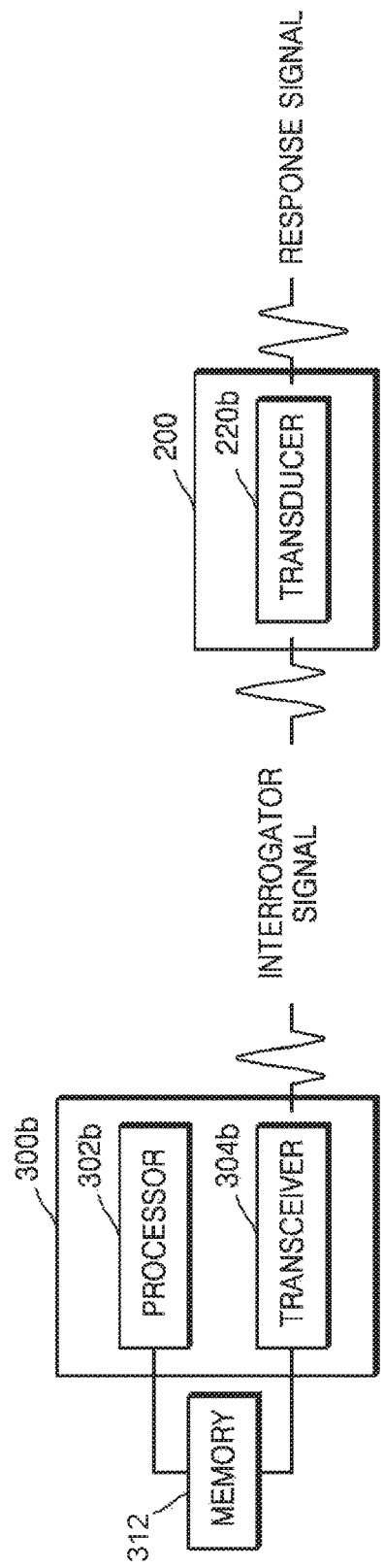
FIG. 3B illustrates an electronic device and a sensor, according to an example embodiment.

Referring to FIGS. 1B, 2B, and 3B, the reader 300b may emit an interrogator signal, and the electronic device 200 may emit a response signal upon receiving the interrogator signal from the reader 300b, according to an example embodiment. The reader 300b may detect the response signal to identify the electronic device 200, and determine a location of the identified electronic device 200.

The reader 300b is illustrated in FIG. 3B as including a processor 302b and a transceiver 304b, but is not limited thereto. For example, the transceiver 304b might not be included in the reader 300b, and may be an element of other device.

The processor 302b of the reader 300b may control operations of methods according to an example embodiment. The processor 302b may be a controller, a microcontroller, or a part thereof. The controller and microcontroller may include a plurality of modules, and each module may perform at least one function or at least one operation.

The transceiver 304b may emit an interrogator signal, and receive a response signal emitted from the electronic device 200. The transceiver 304a may consist of a transmitter for the interrogator signal and a receiver for the response signal. The reader 300b may be an RFID reader.

The reader 300b may further include a memory 312 for storing a program, one or more instructions, or data. The memory 312 may be included into the reader 300b or may be a separate element. The processor 302b of the reader 300b may execute a control program, instruction, or data stored in the memory to perform operations of methods according to an example embodiment. The processor 302b may be configured to be coupled with the memory to execute instructions stored in the memory.

The electronic device 200 may include a transducer 220b. The transducer 220b may generate a response signal transduced from an interrogator signal. In an example embodiment, the reader 300b may include a sensor which generates the response signal by using the interrogator signal for power. In an example embodiment, the sensor may be a passive sensor. For example, when the sensor is an SAW sensor, the interrogator signal is transduced into a surface acoustic wave which is then transduced into the response signal. Response signals emitted by a plurality of transducers of the electronic devices may be distinguished from each other. In an example embodiment, the response signals may have different characteristics, and the reader 300b may identify, based on different signal characteristics, the electronic device 200 which has emitted a response signal. That is, the response signal generated by transducers of the electronic devices may be used as IDs of the electronic devices.

Figure 4:
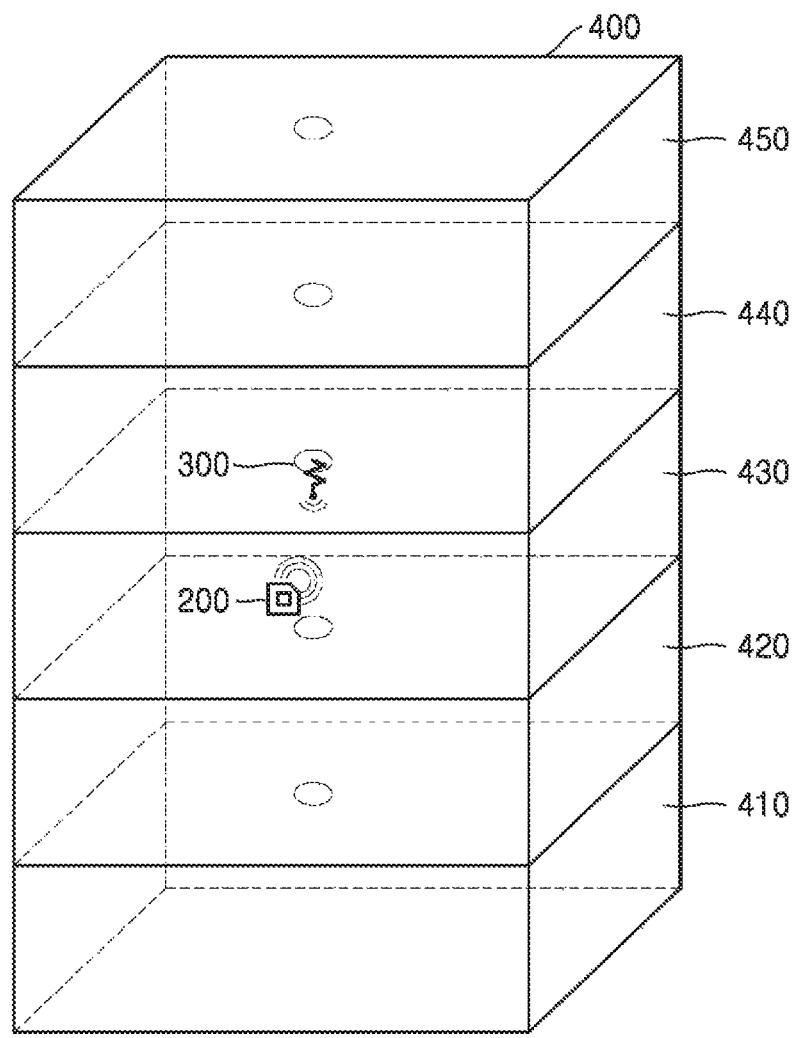
FIG. 4 schematically illustrates a perspective view of an indoor environment according to an example embodiment.

FIG. 4 schematically illustrates a perspective view of an indoor environment according to an example embodiment.

The indoor environment may be a building 400 which consists of a plurality of floors 410, 420, 430, 440, and 450, corresponding to the floor 100a. The sensors 300 are located in each floor, as described above. The sensors may be located on a ceiling, but is not limited thereto. Location information about a sensor 300 may include information about a floor 430 where the sensor 300 is located in the building 400. The electronic device 200 may acquire location information about the sensor 300, and determine which floor the electronic device 200 is located in the building 400.

In an example embodiment, location information about a sensor may include information about two dimensional coordinates on a floor where the sensor is located, and the electronic device 200 may determine a location of the electronic device 200 on a two dimensional coordinates based on acquiring the location information about the sensor.

In an example embodiment, the electronic device 200 may detect one of response signals based on at least one among signal strengths and delay times, for example, detect a response signal that is received the earliest or that has the greatest signal strength.

In an example embodiment, the electronic device 200 may determine its location on two dimensional coordinates based on response signals from sensors that are located in the same floor.

An example embodiment described with reference to FIG. 4 is applicable to example embodiments described above with reference to FIGS. 1A to 3B.

Figure 5A:
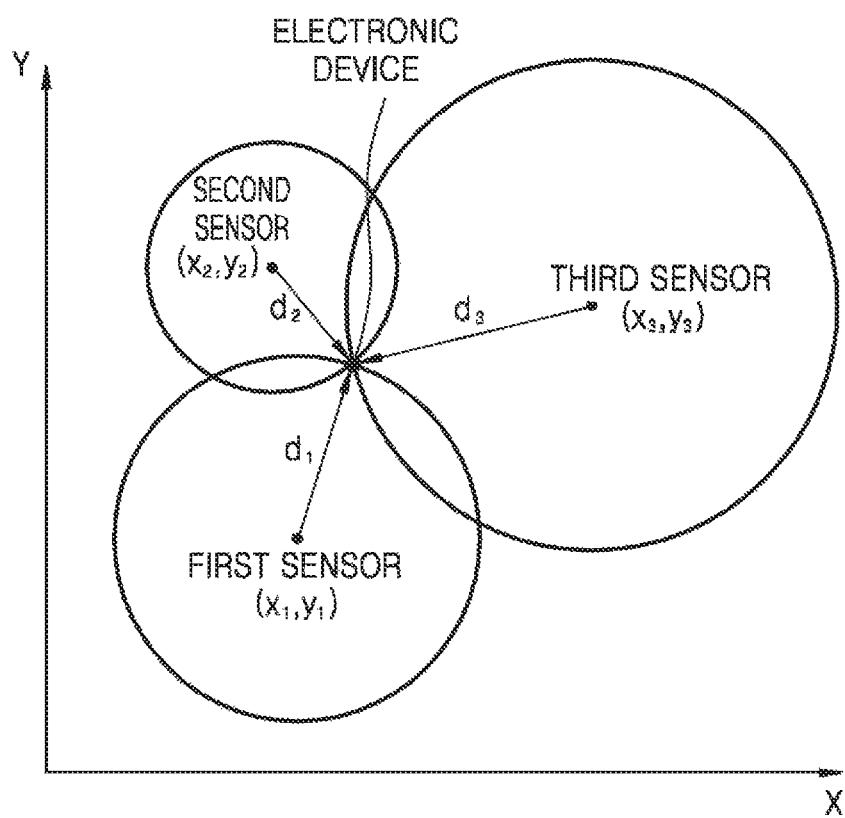
FIG. 5A illustrates a graph representing locations of three sensors and an electronic device, according to an example embodiment.

FIG. 5A illustrates a graph representing locations of three sensors and a location of an electronic device according to an example embodiment.

In an example embodiment, the electronic device may determine its location based on location information about three sensors. For example, the location of the electronic device may be determined as a center of three sensors.

The location of the electronic device might not be the center of three sensors. In order to improve the accuracy, triangulation may be used as illustrated in FIG. 5A. Triangulation may be performed based on a received signal strength indicator (RSSI).

$$P(d)=P(d_0)+10n\log_{10}(d/d_0)+X_\sigma \qquad \text{Equation 1}$$

In Equation 1, d represents a distance between the electronic device a sensor, P(d) represents a signal strength of response signal that is emitted by a sensor at a distance d away from the electronic device and detected by the electronic device, d0 represents a reference distance, P(d0) represents a signal strength of response signal that is emitted by a sensor at a reference distance d0 away from the electronic device and detected by the electronic device, n is a path attenuation coefficient, and $X\sigma$ is a normal random variable with a standard deviation of $\sigma$.

Values of d0, n, and $X\sigma$ may be predetermined. A value of P(d0) may be predetermined or pre-measured. The electronic device may detect three response signals emitted from three sensors, and calculate distances between the electronic device and three sensors based on signal strengths of three response signals.

The distance d may be expressed as Equation 2 based on Equation 1.

$$d = d_0 \times 10^{[P(d) - P(d_0) - X_0]/(10n)} \quad \text{Equation 2}$$

Referring to FIG. 5A, locations of three sensors, and distances between the electronic device and three sensors may be expressed as Equation 3.

$$(x_1-x)^2 + (y_1-y)^2 = d_1^2$$

$$(x_2-x)^2 + (y_2-y)^2 = d_2^2$$

$$(x_3-x)^2 + (y_3-y)^2 = d_3^2 \quad \text{Equation 3}$$

The electronic device may determine its location based on location information about three sensors and distances between the electronic device and three sensors.

An interrogator signal emitted by the electronic device may be received at more than three sensors, and each sensor may emit a response signal. In an example embodiment, the electronic device may detect three response signals among more than three response signals, and determine its location based on the detected three response signals. For example, the electronic device may determine its location based on three response signals that are detected by the electronic device earlier than other response signals. That is, three response signals may be detected based on a time period from transmitting an interrogator signal and receiving a response signal.

In an example embodiment, the electronic device may detect more than three response signals, and determine its location based on three response signals among more than three response signals. For example, the electronic device may use three response signals that have greater signal strength than other response signals to determine its location.

FIG. 5B illustrates a graph representing locations of three readers and a location of an electronic device according to an example embodiment.

In an example embodiment, the electronic device may receive interrogator signals from a plurality of readers, and emit a plurality of response signals, and each reader may detect a response signal. A location of the electronic device may be determined by three readers among readers that have received response signals from the electronic device. For example, the location of the electronic device may be determined based on location information about three readers.

In order to improve the accuracy, triangulation may be used as illustrated in FIG. 5B. Triangulation may be performed based on a received signal strength indicator (RSSI).

$$P(d) = P(d_0) + 10n \log_{10}(d/d_0) + X_\sigma \quad \text{Equation 4}$$

In Equation 4, d represents a distance between the electronic device a reader, P(d) represents a signal strength of response signal that is emitted by the electronic device at a distance d away from the reader and detected by the reader, d0 represents a reference distance, P(d0) represents a signal strength of response signal that is emitted by the electronic device at a reference distance d0 away from the reader and detected by the reader, n is a path attenuation coefficient, and $X\sigma$ is a normal random variable with a standard deviation of $\sigma$.

Values d0, n, and $X\sigma$ may be predetermined. A value P(d0) may be predetermined or pre-measured. Distances between the electronic device and three readers may be calculated based on signal strengths of three response signals detected at the electronic device.

The distance d may be expressed as Equation 5 based on Equation 4.

$$d = d_0 \times 10^{[P(d) - P(d_0) - X_{94}]/(10n)} \quad \text{Equation 5}$$

Referring to FIG. 5B, locations of three sensors, and distances between the electronic device and three sensors may be expressed as Equation 6.

$$(x'_1-x)^2 + (y'_1-y)^2 = d'^2_1$$

$$(x'_2-x)^2 + (y'_2-y)^2 = d'^2_2$$

$$(x'_3-x)^2 + (y'_3-y)^2 = d'^2_3 \quad \text{Equation 6}$$

A location of the electronic device may be determined based on location information about three readers and distances between the electronic device and three readers.

The electronic device may emit a plurality of response signals in response to a plurality of interrogator signals from a plurality of readers. The plurality of readers may receive response signals emitted by the electronic device. A location of the electronic device may be determined based on three response signals of three readers among readers that have received response signals from the electronic device. For example, the location of the electronic device may be determined based on three response signals of three readers that have received and detected three response signals earlier than other readers. Based on a time period from transmitting an interrogator signal to detecting a response signal, three readers may be determined among the readers.

In an example embodiment, the location of the electronic device may be determined based on three response signals that have greater signal strength than other response signals.

In an example embodiment, three readers may be determined by a hub communicating with the readers.

Figure 6:
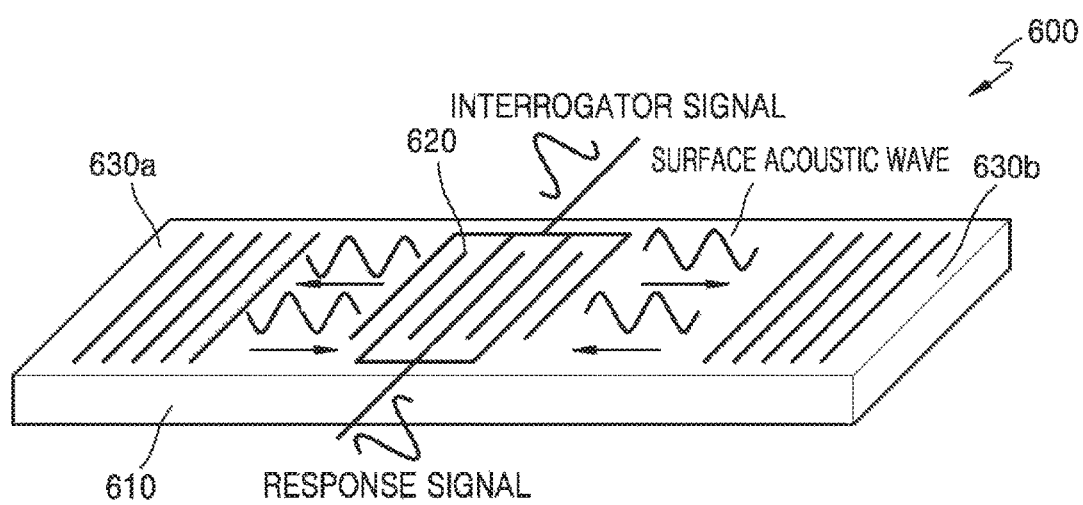
FIG. 6 illustrates an example sensor.

FIG. 6 illustrates an example sensor.

Referring to FIG. 6, a sensor or sensors 300 may be a surface acoustic wave (SAW) sensor or sensors 600. The SAW sensor 600 may include a piezoelectric substrate 610, an interdigital transducer 620, and reflection gratings 630a and 630b. The interdigital transducer 620 and the reflection gratings 630a and 630b may be patterned on the substrate 610, and separated from each other.

In an example embodiment, an interrogator signal may be an RF signal, and the SAW sensor 600 may include an antenna. The interrogator signal emitted from the electronic device may be received at the SAW sensor 600 via the antenna, and a response signal generated based on transduction of the response signal may be emitted from the SAW sensor 600.

In response to receiving an interrogator signal at the SAW sensor 600, the interdigital transducer 620 may generate an electric field on the substrate 610. The generated electric field vibrates the substrate 610 by piezoelectric effect, thereby, a surface acoustic wave propagates across a surface of the substrate 610. That is, the interrogator signal received at the SAW sensor 600 is transduced to a surface acoustic wave by the interdigital transducer.

The surface acoustic wave transduced from the interrogator signal is propagated in opposite directions across the surface of the substrate 610 to the reflection gratings 630a and 630b. The surface acoustic wave is reflected back by the reflection gratings 630a and 630b and propagated across the surface of the substrate 610 to the interdigital transducer 620, and then transduced to a response signal by the interdigital transducer. The SAW sensor 600 is illustrated in FIG. 6 as including two reflection gratings 630a and 630b, but is not limited thereto, may include one reflection grating.

A response signal generated by a sensor may vary according to an interior design of the SAW sensor 600. For example, a frequency, a peak frequency, and a delay time of the response signal may vary according to the interior design of the SAW sensor 600, for example, physical characteristics of components included in the sensor, a configuration of components, and a pattern of components. The delay time of the response signal may be referred to as a time period from receiving an interrogator signal and to emitting a response signal. A response signal generated by each sensor may be used as an ID of each sensor by differentiating an interior design of each sensor.

A frequency and a peak frequency of a response signal may vary according to a pattern of the interdigital transducer 620 patterned on the substrate 610. The SAW sensors 600 may be designed so as to emit different response signals (of different peak frequencies), and the electronic device may identify, based on a peak frequency of a detected response signal, a sensor that has emitted the detected response signal. That is, a peak frequency of the response signal may function as an ID of the SAW sensor 600. A peak frequency may be a resonance frequency of the response signal and the interrogator signal. For example, a plurality of frequency component signals are continuously emitted as an interrogator signal, and the SAW sensor 600 may receive the plurality of frequency component signals to generate a response signal resonating with the interrogator at a certain frequency by a pattern of the interdigital transducer 620. That is, the response signal has a maximum magnitude around the certain frequency.

In an example embodiment, a delay time of a response signal may vary according to distance between the interdigital transducer 620 and the reflection gratings 630a and 630b. Sensors may be designed so as to emit different response signals (of different delay times), and the electronic device may identify, based on a delay time of a detected response signal, a sensor that has emitted the detected response signal. A travel time of the response signal from the SAW sensor 600 to the electronic device is negligibly short compared to its delay time, thus, the delay time of the response signal may be used as an ID of the SAW sensor 600.

In an example embodiment, when the readers 300b are used, the electronic device may include the SAW sensor 600 designed to emit a different response signal from other SAW sensors, the electronic device that has emitted the response signal may be identified based on based on a signal strength or a delay time of the response signal. A travel time of the response signal from the electronic device to a reader is negligibly short compared to its delay time, and thus, the delay time of the response signal may be used as an ID of the electronic device.

Figure 7:
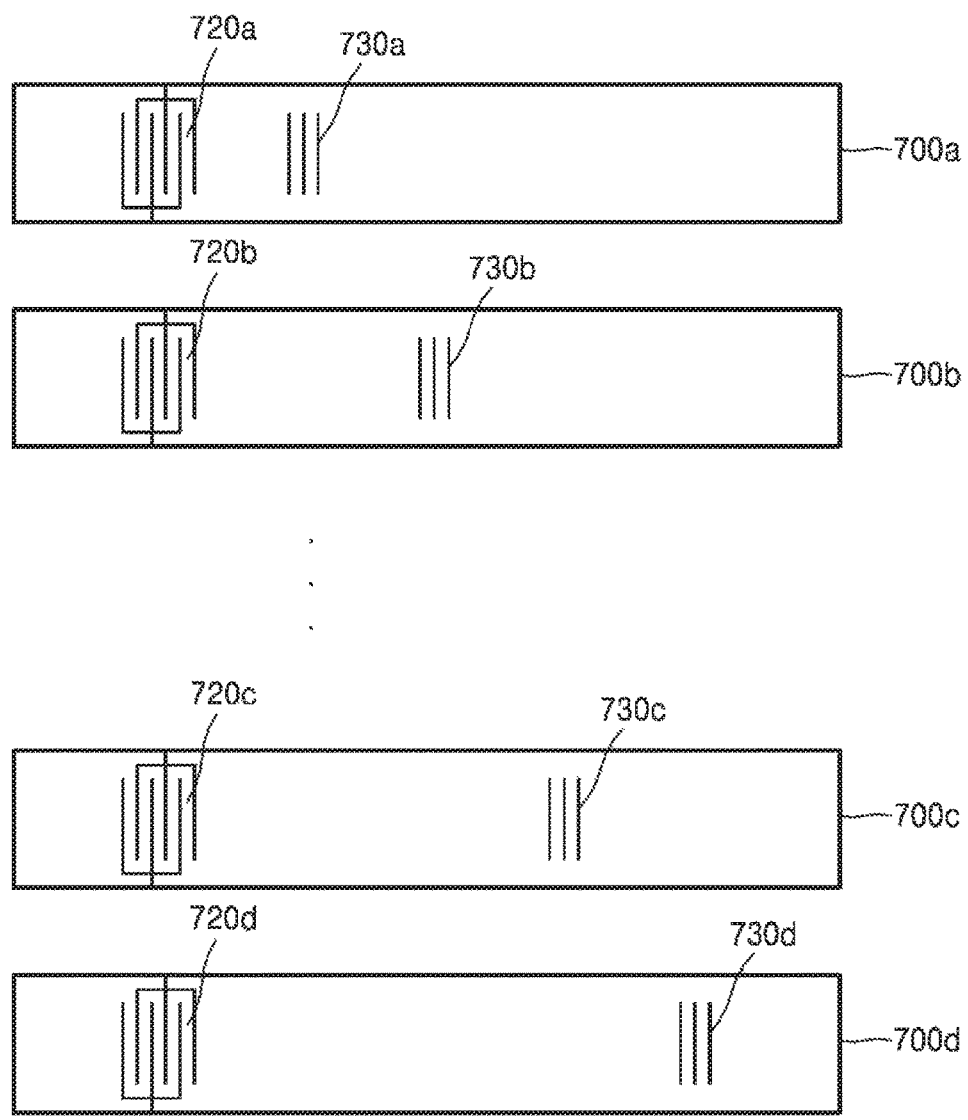
FIG. 7 illustrates example designs of sensors.

A delay time of a response signal may vary according to a distance between an interdigital transducer and reflection gratings, which as described by referring to FIG. 7.

FIG. 7 illustrates example designs of sensors.

Referring to FIG. 7, SAW sensors 700a, 700b, 700c, and 700d respectively includes interdigital transducers 720a, 720b, 720c, and 720d, and reflection gratings 730a, 730b, 730c, and 730d. A distance between an interdigital transducer 720a and a reflection grating 730a of an SAW sensor 700a is narrower than other SAW sensors 700b, 700c, and 700d.

Upon receiving an interrogator signal from the electronic device, the interrogator signal received at the SAW sensor 700a is transduced to a surface acoustic wave by the interdigital transducer 720a, and then propagated to the reflection grating 730a. The surface acoustic wave propagated to the reflection grating 730a is reflected by the reflection gratings 730a, and propagated back to the interdigital transducer 720a, and then transduced to a response signal by the interdigital transducer 720a.

The distance between the interdigital transducer 720a and the reflection grating 730a of the SAW sensor 700a is narrower than that of other SAW sensors 700b, 700c, and 700d, thus, a delay time of a response signal generated by the SAW sensor 700a is shorter than that of other SAW sensors 700b, 700c, and 700d.

Therefore, even when an interrogator signal from the electronic device is received by the SAW sensors 700a, 700b, 700c, and 700d at the same time, delay times of response signals emitted from the SAW sensors 700a, 700b, 700c, and 700d may be different from each other.

In an example embodiment, when the readers 300b are used, an electronic device may include sensors such as the SAW sensors 700a, 700b, 700c, and 700d.

Figure 8:
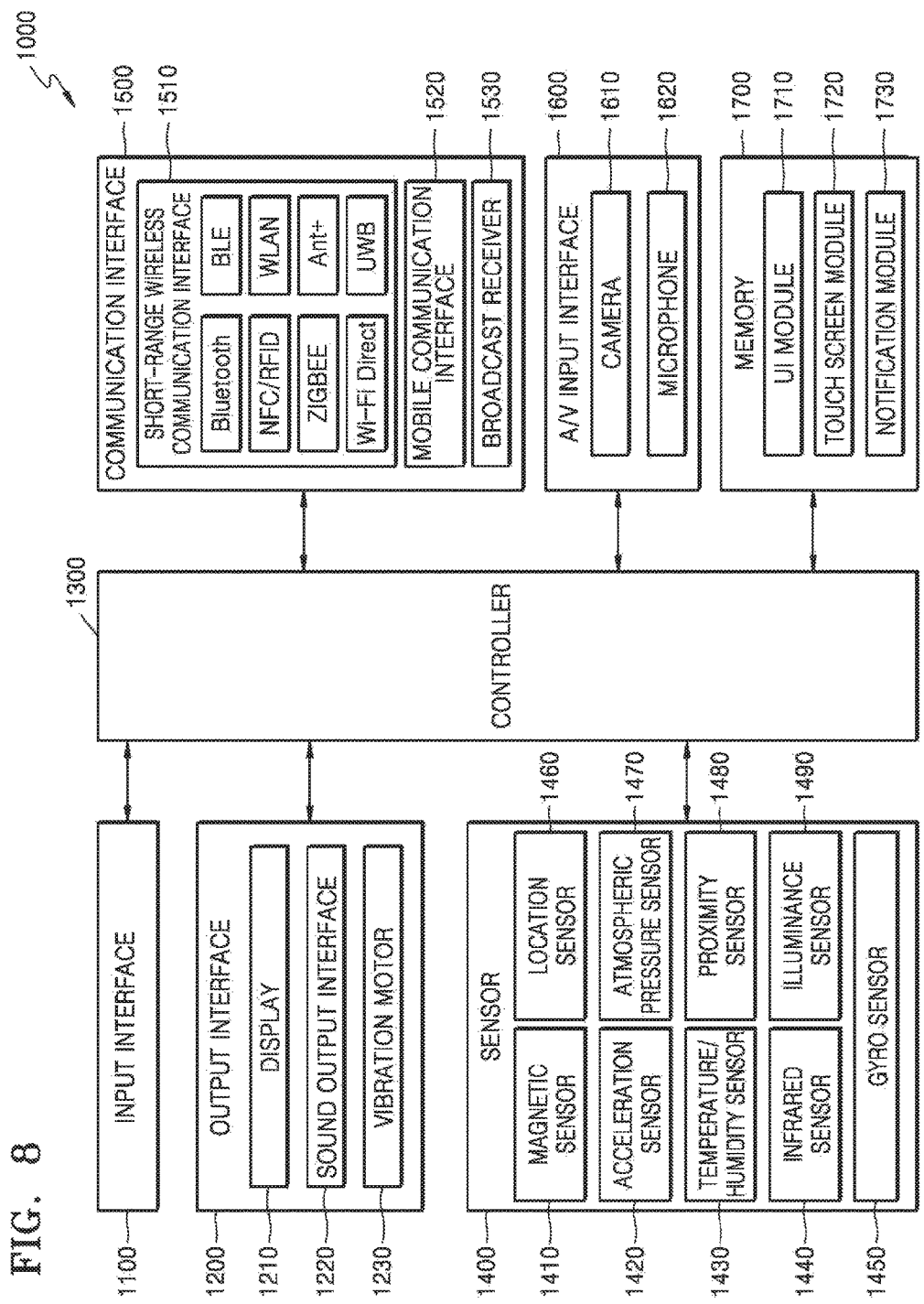
FIG. 8 illustrates an example electronic device.

Referring to FIG. 8, an example electronic device 1000 may correspond to the electronic device 200 of FIG. 3A. The electronic device 1000 may include a controller 1300, e.g., a processor or a microprocessor, and a short-range wireless communication interface 1510 which respectively correspond to the processor 202a and the transceiver 204a of the electronic device 200 of FIG. 3A.

The electronic device 1000 may further include an input interface 1100, an output interface 1200, a sensor 1400, a communication interface 1500, an audio/video (A/V) interface 1600, and a memory 1700. However, all the components shown in FIG. 8 are not essential components of the electronic device 1000. The electronic device 1000 may be implemented by more or less components than shown in FIG. 8.

The input interface 1100 may be used for a user to input data to control the electronic device 1000. For example, the input interface 1100 may be a key pad, a dome switch, a touch pad (e.g., contact electrostatic capacitive type, pressure resistive film type, infrared detection type, surface acoustic wave propagation type, integral strain gauge type, piezo-effect type, etc.), a jog wheel, and a jog switch, but not limited thereto.

The output interface 1200 may be used for outputting an audio signal, a video signal, or a vibration signal, and may include a display 1210, a sound output interface 1220, and a vibration motor 1230. The output interface 1200 may display on a map a location corresponding to the electronic device 1000.

The display 1210 may display information processed in the transmitting device 1000. The display 1210 and a touch pad may be overlaid with each other to function as a touch screen, and the display 1210 may be used as not only an output device but also an input device. The display 1210 may include at least one among a liquid crystal display, a thin-film transistor-liquid crystal display, an organic light-emitting diode, a flexible display, a 3D display, and an electrophoretic display. Furthermore, the electronic device 1000 may include two or more displays 1210 according to exemplary embodiments. The two or more displays 1210 may be disposed to face each other across a hinge.

The sound output interface 1220 may output audio data received from the communication interface 1500 or stored in the memory 1700. Furthermore, the sound output interface 1220 may output a sound signal (e.g., a call signal reception sound, a message reception sound, a notification sound, etc.) related to a function performed by the electronic device 1000. The sound output interface 1220 may include a speaker, a buzzer, etc.

The vibration motor 1230 may output a vibration signal. For example, the vibration motor 1230 may output a vibration signal based on outputting audio or video data. The vibration motor 1230 may output a vibration signal in response to receiving a touch input.

The controller 1300 may generally control the overall operation of the electronic device 1000. For example, the controller 1300 may execute programs stored in the memory 1700 to control the input interface 1100, the output interface 1200, the sensor 1400, the communication interface 1500, and the A/V input interface 1600, etc. The controller may control the camera 1610 so as to perform operations of the electronic device 1000 as described above.

The sensor 1400 may sense a state of or ambient state of the electronic device 1000 and transmit a result of the sensing to the controller 1300.

The sensor may include at least one among a magnetic sensor 1410, an acceleration sensor 1420, a temperature/humidity sensor 1430, an infrared sensor 1440, a gyroscope 1450, a location sensor 1460 such as a GPS, an atmospheric pressure sensor 1470, a proximity sensor 1480, and an illuminance sensor 1490, but not limited thereto. A function of each sensor would be intuitively inferred by those of ordinary skill in the art, and detailed explanation thereof is omitted.

The communication interface 1500 may include one or more elements For example, the communication interface 1500 may include a short-range communication interface 1510, a mobile communication interface 1520, and a broadcast receiver 1530.

The short-range communication interface 1510 may include a Bluetooth communication interface, a BLE communication interface, a NFC interface, a Wi-Fi communication interface, a ZigBee communication interface, an IrDA communication interface, a WFD communication interface, a UWB communication interface, an Ant+communication interface, and a Z-wave communication interface, but is not limited thereto. The short-range communication interface 1510 may be an RFID reader.

The mobile communication interface 1520 may communicate a radio signal with at least one among a base station, an external terminal, and a server via a mobile communication network. The wireless signal may include a voice call signal, a video call signal, or any types of data to communicate a text/multimedia message.

The broadcast receiver 1530 may receive a broadcasting signal and/or broadcast-related information from the outside via a broadcasting channel. The broadcasting channel may include a satellite channel, a terrestrial channel, etc. The electronic device 1000 might not include the broadcast receiver 1530 according to exemplary embodiments.

The A/V input interface 1600 may include a camera 1610 and a microphone 1620 to receive an audio signal or a video signal. Images captured by the camera 1610 may be processed by the controller 1300 or an image processor.

Images captured by the camera 1610 may be stored in the memory 1700, or transmitted to the outside through the communication interface 1500. The electronic device 1000 may include two or more cameras 1610 according to exemplary embodiments.

The microphone 1620 may receive and process a sound signal from the outside to convert it to an electronic sound data. For example, the microphone 1620 may receive a sound signal from an external device or a speaker. The microphone 1620 may employ any of various noise-reduction algorithms to reduce noise occurring while receiving a sound signal from the outside.

The memory 1700 may store programs for processing and controlling of the controller 1300, and store data inputted to or outputted from the electronic device 1000.

The memory 1700 may include at least one storage medium among a flash memory type memory, a hard disk type memory, a multimedia card micro type memory, a card type memory (e.g., a secure digital (SD) memory, an extreme digital (XD) memory, etc.), a random access memory (RAM), a static RAM (SRAM), a read-only memory (ROM), an electrically erasable programmable ROM (EEPROM), a programmable ROM (PROM), a magnetic memory, a magnetic disk, and an optical disk, but is not limited thereto.

Programs stored in the memory 1700 may be classified into a plurality of modules according to their functions. For example, the plurality of modules may be a user interface (UI) module 1710, a touch screen module 1720, and a notification module 1730, but are not limited thereto.

A UI or a GUI may be displayed by the UI module 1710 according to each program or application to interact with the electronic device 1000. A user's touch gesture on a touch screen may be detected and information regarding the touch gesture may be transmitted to the controller 1300 by the touch screen module 1720. The touch screen module 1720 may be embodied as hardware including a controller. A signal for notifying an occurrence of an event at the electronic device 1000 may be generated by the notification module 1730. A notification signal may be output by the notification module 1730 through the display unit 1210 in the form of a video signal, through the sound output unit 1220 in the form of a sound signal, or though the vibration motor 1230 in the form of a vibration signal.

In an example embodiment, the electronic device 1000 may include an RFID reader. Furthermore, the electronic device 1000 may include an input device including a sensor such as an SAW sensor. The input device may be a stylus which is inserted into a socket of the electronic device 1000. Accordingly, a user may conveniently carry the electronic device 1000 and the input device together. The SAW sensor included in the stylus may function as a temperature sensor.

In an example embodiment, the RFID reader of the electronic device 1000 may emit an interrogator signal based on a predetermined standard. For example, the RFID reader may emit an interrogator signal when the stylus inserted in the electronic device 1000 is pulled out to a certain extent. For example, the RFID reader may emit an interrogator signal when a certain application is executed on the electronic device 1000. Therefore, specific absorption rate of the RFID reader may be reduced.

In an example embodiment, the RFID reader may emit an interrogator signal when the stylus receives a certain input. For example, the RFID reader may emit the interrogator signal when a certain button on the stylus is pushed, when the button is pushed to a certain depth, when the button is pushed equal to or more than certain times, or when the button is pushed equal to or longer than a certain period of time. Therefore, power consumption of the RFID reader may be reduced.

In an example embodiment, the electronic device 1000 may adjust the power level of the RFID reader included in the electronic device 1000 based on a distance between the electronic device 1000 (or the RFID reader included therein) and the input device (e.g., a stylus). The distance may be determined based on a response signal that is emitted from a sensor (e.g., a SAW sensor) of the input device in response to the interrogator signal. In an example embodiment, the electronic device 1000 may decrease a power level of the RFID reader included in the electronic device 1000 as the distance becomes shorter. In an example embodiment, the electronic device 1000 may decrease the power level of the RFID reader when the response signal from the sensor of the input device has a signal strength enough to be detected.

In an example embodiment, the electronic device 1000 may display a user interface (UI) corresponding to a distance between the electronic device 1000 (or the RFID reader included therein) and the input device (e.g., a stylus). For example, the electronic device 1000 may display, based on the distance, a UI for adjusting the power level of the RFID reader. Accordingly, the power level of the RFID reader may be conveniently adjusted by a user based on his usage environment in which the input device is used remote from or close to the electronic device 1000. Therefore, power consumption of the RFID reader may be controlled. In an example embodiment, a UI displayed on the electronic device 1000 may vary based on the distance. For example, a UI for nearby use of the input device may be displayed when the distance is short enough to use the input device near the electronic device 1000. Further, a UI for remote use of the input device may be displayed when the distance is out of the nearby use of the input device or when the distance is in a range for the remote use of the input device. The UI for the nearby use of the input device may include icons regarding operations that are performed by touching the input device (e.g., a stylus) on a screen of the electronic device 1000. The UI for the remote use of the input device may include icons regarding operations (e.g., capture, motion detection, temperature measurement) that are performed by pushing a button of the input device. The icons in the UI for the remote use of the input device may be selected based on how the button of the input device is pushed (e.g., depth, times, or period of time that the button is pushed).

In an example embodiment, the RFID reader may emit an interrogator signal when a battery of the electronic device 1000 drops to or under a certain level. In an example embodiment, a Bluetooth communication interface of the electronic device 1000 may stop operating when a battery of the electronic device 1000 is equal to or less than a certain level.

In an example embodiment, the electronic device 1000 include the RFID reader to communicate with other devices including sensors that are designed differently (e.g., SAW sensors designed differently as illustrated in FIGS. 6 and 7). Each of the other devices includes a sensor designed differently from others and emits a unique response signal in response to an interrogator signal from the electronic device 1000. Therefore, the electronic device 1000 may identify sources of received response signals. The electronic device 1000 may execute an application based on the received response signals.

In an example embodiment, the electronic device 1000 may lock its screen when a sensor (e.g., a SAW sensor) is not detected. For example, when a smartwatch including the SAW sensor is away from the electronic device to a certain extent, the electronic device 1000 may lock its screen. Further, when the smartwatch is close to the electronic device 1000 to a certain extent, the electronic device 1000 may unlock its screen.

In an example embodiment, the input device may be a stylus including buttons respectively corresponding to SAW sensors. Each of the SAW sensors may generate a response signal in response to an interrogator signal from the electronic device 1000 when a corresponding button is pushed. The SAW sensors are designed differently from each other to generate different response signals in response to the same interrogator signal. Therefore, the electronic device 1000 may identify which button is pushed at the stylus and perform corresponding operations.

In an example embodiment, the input device may be a keyboard including keys respectively corresponding to SAW sensors. Each of the SAW sensors may generate a response signal in response to an interrogator signal from the electronic device 1000 when a corresponding key is pushed. Therefore, the electronic device 1000 may identify which key is pushed at the keyboard and perform corresponding operations. The input device is not limited to the stylus and keyboard.

Furthermore, it is described above that embodiments of the present disclosure are implemented by a hardware component, but embodiments of the present disclosure may be implemented by a software component such as a computer program executable by a CPU. A computer program may be stored in a non-transitory computer readable medium, and provided to a computer. The non-transitory computer readable medium may include a tangible storage medium. The non-transitory computer readable medium may be a magnetic storage medium (e.g., a flexible disc, a magnetic tape, and a hard disk drive), a magneto-optical medium (e.g., a magneto-optical disk), a CD-ROM, CD-R, CD-R/W, a semiconductor memory (e.g., a mask ROM, a PROM, an EPROM, a flash ROM, a RAM). Further, a computer program may be provided to a computer by a transitory computer readable medium.

The transitory computer readable medium may include an electronic signal, an optical signal, and an electronic wave. The transitory computer readable medium may provide a computer program to a computer through a wire communication channel such as a wire and an optical fiber or a wireless communication channel.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

The invention claimed is:

1. A positioning method comprising:
   emitting an interrogator signal from an electronic device;
   obtaining, by at least one processor of the electronic device, a response signal that is generated and emitted by a sensor among a plurality of sensors in response to the interrogator signal;
   obtaining, by the at least one processor, location information about the sensor by identifying the sensor based on the response signal; and
   identifying, by the at least one processor, a location of the electronic device based on the location information about the sensor, wherein the response signal is generated based on transduction of the interrogator signal,
wherein the obtaining the response signal comprises:
obtaining a plurality of response signals that are generated and emitted by the plurality of sensors based on the interrogator signal, the response signal being one of the plurality of response signals, and
identifying the response signal of the sensor, among the plurality of response signals, as a signal that has arrived at the electronic device earlier than other response signals among the plurality of response signals of other sensors of the plurality of sensors, or as a signal having a greater signal strength than that of the other response signals of the other sensors.

2. The positioning method of claim 1, wherein the plurality of response signals have characteristics different from each other.

3. The positioning method of claim 1, wherein the plurality of sensors comprise a plurality of passive sensors having different designs.

4. The positioning method of claim 1, wherein the plurality of sensors comprise a plurality of surface acoustic wave (SAW) sensors, each of the plurality of SAW sensors comprising a substrate and an interdigital transducer patterned on the substrate, and
the interdigital transducers of the plurality of SAW sensors have different patterns, respectively, so that the plurality of response signals emitted by the plurality of SAW sensors, respectively, has different characteristics.

5. The positioning method of claim 1, wherein the plurality of sensors comprise a plurality of surface acoustic wave (SAW) sensors, each of the plurality of SAW sensors comprising an interdigital transducer and a reflection grating distanced apart from the interdigital transducer, and
a distance between the interdigital transducer and the reflection grating differs among the plurality of SAW sensors so that the plurality of response signals emitted by the plurality of SAW sensors, respectively, has different delays.

6. The positioning method of claim 1, wherein the obtaining the response signal further comprises identifying supplementary response signals, among the other response signals, that are generated and emitted by at least two sensors among the other sensors based on the interrogator signal,
the obtaining the location information comprises obtaining location information about the at least two sensors by identifying the at least two sensors based on the supplementary response signals, and
the obtaining the location of the electronic device comprises triangulating a location of the sensor and locations of the at least two sensors.

7. The positioning method of claim 6, wherein the response signal from the sensor and the supplementary response signals are received, by the electronic device, earlier than response signals from a remainder of sensors of the plurality of sensors.

8. The positioning method of claim 6, wherein the response signal from the sensor and the supplementary response signals have greater signal strengths than that of response signals from a remainder of sensors of the plurality of sensors.

9. The positioning method of claim 1, wherein the emitting the interrogator signal comprises:
emitting the interrogator signal based on identifying, by the at least one processor, that the electronic device has moved from an outside of a building to an inside of the building.

10. The positioning method of claim 1, further comprising:
prior to the emitting the interrogator signal, receiving, by the electronic device, a global positioning system (GPS) signal,
wherein the emitting the interrogator signal comprises emitting the interrogator signal in response to stopping the receiving the GPS signal.

11. The positioning method of claim 1, further comprising:
storing identification information and location information about the plurality of sensors,
wherein the obtaining the location information comprises obtaining the location information about the sensor by identifying the sensor based on the identification information and the location information about the sensor and the response signal emitted by the sensor.

12. The positioning method of claim 1, wherein the identifying the location of the electronic device comprises:
identifying the location of the electronic device at the electronic device.

13. An electronic device comprising:
a memory configured to store instructions; and
at least one processor configured to execute the instructions to:
control to emit an interrogator signal from the electronic device,
obtain a response signal that is generated and emitted by a sensor among a plurality of sensors in response to the interrogator signal,
obtain location information about the sensor by identifying the sensor based on the response signal, and
identify a location of the electronic device based on the location information about the sensor,
wherein the response signal is generated based on transduction of the interrogator signal, and
the at least one processor is further configured to execute the instructions to:
obtain a plurality of response signals that are generated and emitted by the plurality of sensors based on the interrogator signal, the response signal being one of the plurality of response signals, and
identify the response signal of the sensor, among the plurality of response signals, as a signal that has arrived at the electronic device earlier than other response signals among the plurality of response signals of other sensors of the plurality of sensors, or as a signal having a greater signal strength than that of the other response signals of the other sensors.

14. The electronic device of claim 13, wherein the plurality of response signals have characteristics different from each other.

15. The electronic device of claim 13, wherein the plurality of sensors comprise a plurality of passive sensors having different designs.

16. The electronic device of claim 13, wherein the at least one processor is further configured to execute the instructions to:
control to obtain supplementary response signals, among the other response signals, that are generated and emitted by at least two sensors among the other sensors based on the interrogator signal, obtain location information about the at least two sensors by identifying the at least two sensors based on the supplementary response signals, and identify the location of the electronic device by triangulating a location of the sensor and locations of the at least two sensors.

17. The electronic device of claim 13, wherein the at least one processor is further configured to execute the instructions to control to emit from the electronic device the interrogator signal based on identifying, by the at least one processor, that the electronic device has moved from an outside of a building to an inside of the building.

18. The electronic device of claim 13, wherein the memory is further configured to store identification information and location information about the plurality of sensors, and the at least one processor is further configured to execute the instructions to control to obtain the location information about the sensor by identifying the sensor based on the identification information and the location information about the sensor, and the response signal emitted by the sensor.

19. The electronic device of claim 13, wherein the at least one processor is further configured to execute the instructions to control to identify the location of the electronic device based on the location information about the sensor.

20. A positioning method comprising:

receiving, by at least one processor of an electronic device, an interrogator signal from a reader among a plurality of readers;

generating a response signal based on transduction of the interrogator signal;

emitting the response signal; and obtaining, by the at least one processor, information about a location of the electronic device, from the reader having received the response signal, wherein the emitting the response signal comprises emitting, by the electronic device, a plurality of response signals in response to a plurality of interrogator signals received by the at least one processor from the plurality of readers, the interrogator signal being one of the plurality of interrogator signals, and obtaining the information comprises identifying the location of the electronic device based on the response signal, among the plurality of response signals, that has arrived at the reader, among the plurality of readers, earlier than other response signals, among the plurality of response signals, have arrived at other readers of the plurality of readers, or based on the response signal, among the plurality of response signals, that has a greater signal strength than that of the other response signals.

* * * * *